(12) United States Patent
Park

(10) Patent No.: US 11,796,139 B2
(45) Date of Patent: *Oct. 24, 2023

(54) LIGHTING MODULE AND LIGHTING DEVICE HAVING SAME

(71) Applicant: LG INNOTEK CO., LTD., Seoul (KR)

(72) Inventor: Hoon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/981,772

(22) Filed: Nov. 7, 2022

(65) Prior Publication Data

US 2023/0053397 A1 Feb. 23, 2023

Related U.S. Application Data

(63) Continuation of application No. 16/960,128, filed as application No. PCT/KR2019/000294 on Jan. 8, 2019, now Pat. No. 11,519,568.

(30) Foreign Application Priority Data

Jan. 12, 2018 (KR) ................ 10-2018-0004658

(51) Int. Cl.
*F21K 9/68* (2016.01)
*F21S 2/00* (2016.01)
(Continued)

(52) U.S. Cl.
CPC ............ *F21K 9/68* (2016.08); *F21S 2/005* (2013.01); *H01L 33/486* (2013.01); *H01L 33/56* (2013.01);
(Continued)

(58) Field of Classification Search
None
See application file for complete search history.

(56) References Cited

U.S. PATENT DOCUMENTS 5,980,054 A 11/1999 Fukui et al.
8,246,235 B2 8/2012 Ijzerman et al.
(Continued)

FOREIGN PATENT DOCUMENTS

CN 101082721 12/2007
CN 101191860 6/2008
(Continued)

OTHER PUBLICATIONS

International Search Report dated Mar. 29, 2019 issued in Application No. PCT/KR2019/000294.
(Continued)

*Primary Examiner* — Elmito Breval
(74) *Attorney, Agent, or Firm* — KED & ASSOCIATES, LLP

(57) ABSTRACT

The lighting device disclosed in the embodiment of the invention includes a substrate including a metal layer; a plurality of light sources arranged in a first direction on the substrate; a plurality of protrusions having a length in the first direction on the metal layer; and a resin layer disposed on the plurality of light sources and the plurality of protrusions, wherein the metal layer includes a first metal layer electrically connected to the light source and a second metal layer coupled to the plurality of protrusions, and the first metal layer and the second metal layer are separated from each other, and the plurality of protrusions may be disposed to be spaced apart from each other in a second direction perpendicular to the first direction.

20 Claims, 8 Drawing Sheets

(51) Int. Cl.
  *H01L 33/48* (2010.01)
  *H01L 33/56* (2010.01)
  *H01L 33/60* (2010.01)
  *H01L 33/62* (2010.01)
  *F21Y 115/10* (2016.01)

(52) U.S. Cl.
  CPC .............. *H01L 33/60* (2013.01); *H01L 33/62* (2013.01); *F21Y 2115/10* (2016.08)

(56) References Cited

U.S. PATENT DOCUMENTS

| | | |
|---|---|---|
| 8,395,170 B2 | 3/2013 | Kim |
| 8,454,221 B2 | 6/2013 | Urano et al. |
| 8,944,624 B2 | 2/2015 | Kim et al. |
| 9,921,411 B2 | 3/2018 | Lee et al. |
| 10,161,592 B2 | 12/2018 | Laminette et al. |
| 2006/0246233 A1 | 11/2006 | Fukuda |
| 2007/0159843 A1 | 7/2007 | Choi |
| 2008/0130317 A1 | 6/2008 | Shimura et al. |
| 2009/0256993 A1 | 10/2009 | Oku |
| 2010/0157577 A1 | 6/2010 | Montgomery et al. |
| 2010/0245716 A1 | 9/2010 | Mo et al. |
| 2011/0051412 A1 | 3/2011 | Jeong |
| 2011/0234580 A1 | 9/2011 | Wang et al. |
| 2013/0128610 A1 | 5/2013 | Hsu et al. |
| 2014/0092584 A1 | 4/2014 | Ono et al. |
| 2015/0247723 A1 | 9/2015 | Abovitz et al. |
| 2017/0092824 A1 | 3/2017 | Kim et al. |
| 2018/0180249 A1 | 6/2018 | Yamada |

FOREIGN PATENT DOCUMENTS

| | | |
|---|---|---|
| CN | 101625097 | 1/2010 |
| CN | 102130272 | 7/2011 |
| CN | 102374493 | 3/2012 |
| CN | 102679243 | 9/2012 |
| CN | 102901003 | 1/2013 |
| CN | 103292214 | 9/2013 |
| CN | 104181697 | 12/2014 |
| CN | 104819423 | 8/2015 |
| CN | 106154398 | 11/2016 |
| CN | 107401715 | 11/2017 |
| GB | 2443849 | 5/2008 |
| JP | H08-129174 | 5/1996 |
| JP | H10-282343 | 10/1998 |
| JP | 2000-315414 | 11/2000 |
| JP | 2004-241282 A | 8/2004 |
| JP | 2006-053464 | 2/2006 |
| JP | 2009-269492 | 11/2009 |
| JP | 2014-032919 A | 2/2014 |
| JP | 2017-103299 A | 6/2017 |
| KR | 10-2005-0054042 | 6/2005 |
| KR | 10-2009-0012925 | 2/2009 |
| KR | 10-2009-012925 A | 2/2009 |
| KR | 10-2009-0101835 | 9/2009 |
| KR | 10-2011-0108316 | 10/2011 |
| KR | 10-2011-0115740 | 10/2011 |
| KR | 10-2011-0122914 A | 11/2011 |
| KR | 10-2012-0026369 | 3/2012 |
| KR | 10-2013-0135971 A | 12/2013 |
| KR | 10-2017-0037521 | 4/2017 |
| WO | WO 2008/035256 | 3/2008 |

OTHER PUBLICATIONS

European Search Report dated Feb. 12, 2021 issued in Application No. 19739133.7.
Chinese Office Action dated Aug. 24, 2021 issued in Application No. 201980008292.4.
Chinese Office Action dated Feb. 24, 2022 issued in CN Application No. 201980008292.4.
Korean Office Action dated Dec. 10, 2022 issued in Application 10-2018-0004658.
Japanese Office Action dated Jan. 31, 2023 issued in Application 2020-537496.

US 11,796,139 B2

LIGHTING MODULE AND LIGHTING DEVICE HAVING SAME

CROSS-REFERENCE TO RELATED APPLICATIONS

This application is a Continuation application of U.S. patent application Ser. No. 16/960,128 filed Jul. 6, 2020, which is a U.S. National Stage Application under 35 U.S.C. § 371 of PCT Application No. PCT/KR2019/000294, filed Jan. 8, 2019, which claims priority to Korean Patent Application No. 10-2018-0004658, filed Jan. 12, 2018, whose entire disclosures are hereby incorporated by reference.

BACKGROUND

1. Field

An embodiment of the invention relates to a lighting module and a lighting device having a light source and a resin layer.

An embodiment of the invention relates to a lighting module and a lighting device providing a surface light source.

An embodiment of the invention relates to a backlight unit having a lighting module, a liquid crystal display, or a vehicle lamp.

2. Background

Conventional lighting applications include not only a vehicle lighting but also a backlight for a display and a signage. A light source, for example, a light emitting diode (LED) has advantages such as low power consumption, semi-permanent lifetime, fast response speed, safety, environmental friendliness compared to conventional light sources such as fluorescent lamps and incandescent lamps. Such the LED has been applied to various lighting devices such as various display devices, indoor lights or outdoor lights, or the like.

Recently, a lamp employing an LED has been proposed as a vehicle light source. Compared to incandescent lamps, an LED has an advantage in low power consumption. However, since an emitting angle of light emitted from an LED is small, when the LED is used as a vehicle lamp, it is required to increase a light-emitting area of a lamp using the LED. Since a size of an LED is small, it is possible to increase a degree of freedom of design of a lamp, and the LED has economic efficiency due to the semi-permanent lifetime.

BRIEF DESCRIPTION OF THE DRAWINGS

The embodiments will be described in detail with reference to the following drawings in which like reference numerals refer to like elements wherein.

DETAILED DESCRIPTION

Figure 1:
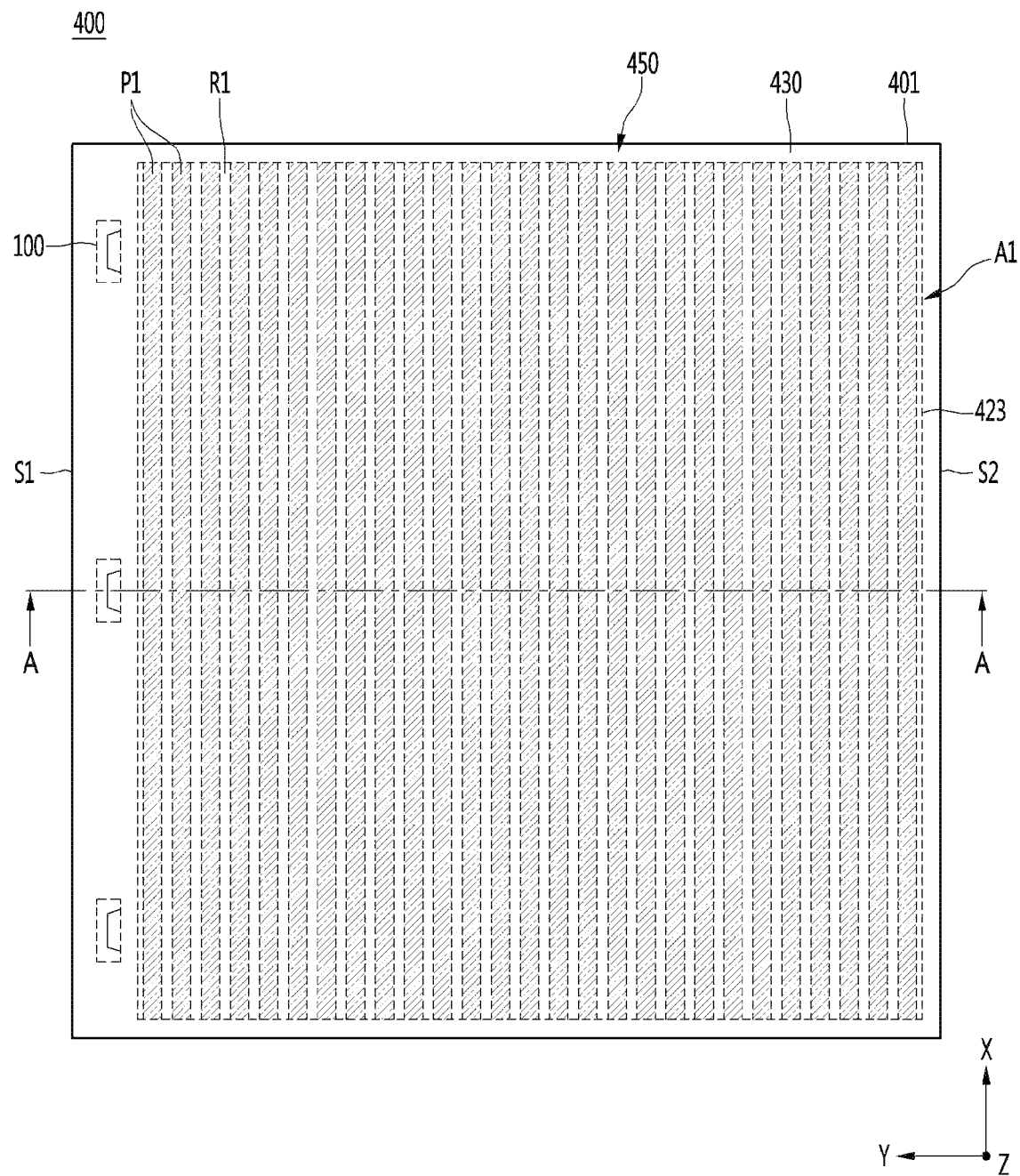
FIG. 1 is a plan view showing a lighting device according to an embodiment of the invention.

Hereinafter, with reference to the accompanying drawings will be described in detail preferred embodiments that may be easily carried out by the person of ordinary skill in the art. However, it should be understood that the configurations shown in the embodiments and drawings described in this specification are only preferred embodiments of the invention, and that there may be various equivalents and modifications that can replace them at the time of application. In the detailed description of the operating principle for the preferred embodiment of the invention, when it is determined that a detailed description of related known functions or configurations may unnecessarily obscure the subject matter of the invention, the detailed description will be omitted. Terms to be described later are terms defined in consideration of functions in the invention, and the meaning of each term should be interpreted based on the contents throughout the present specification. The same reference numerals are used for parts having similar functions and functions throughout the drawings.

The lighting device according to the invention may be applied to various lamp devices that require lighting, such as vehicle lamps, household lighting devices, and industrial lighting devices. For example, when applied to vehicle lamps, head lamps, car lights, side mirror lights, fog lights, tail lamps, brake lights, daytime running lights, vehicle interior lights, door scars, rear combination lamps, backup lamps It is applicable to back. The lighting device of the invention may be applied to indoor and outdoor advertising devices, display devices, and various electric vehicle fields. In addition, it may be applied to all lighting-related fields or advertising-related fields that are currently developed and commercialized or may be implemented according to future technological development.

Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

<Lighting Device>

Figure 2:
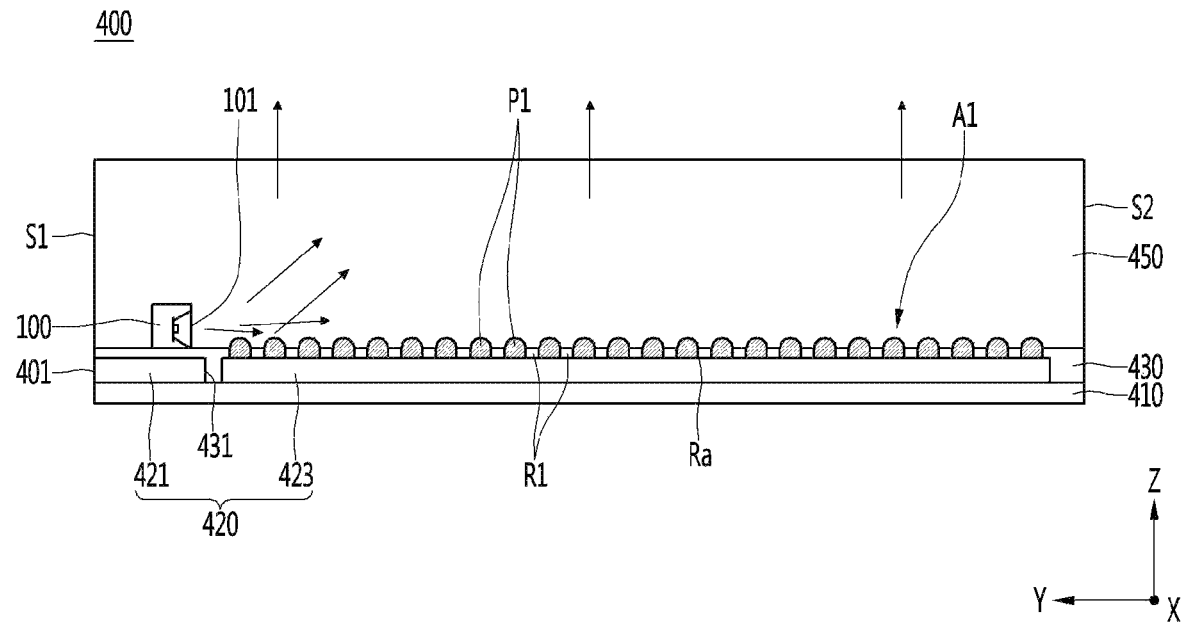
FIG. 2 is a cross-sectional view taken along A-A side of the lighting device of FIG. 1.
Figure 3:
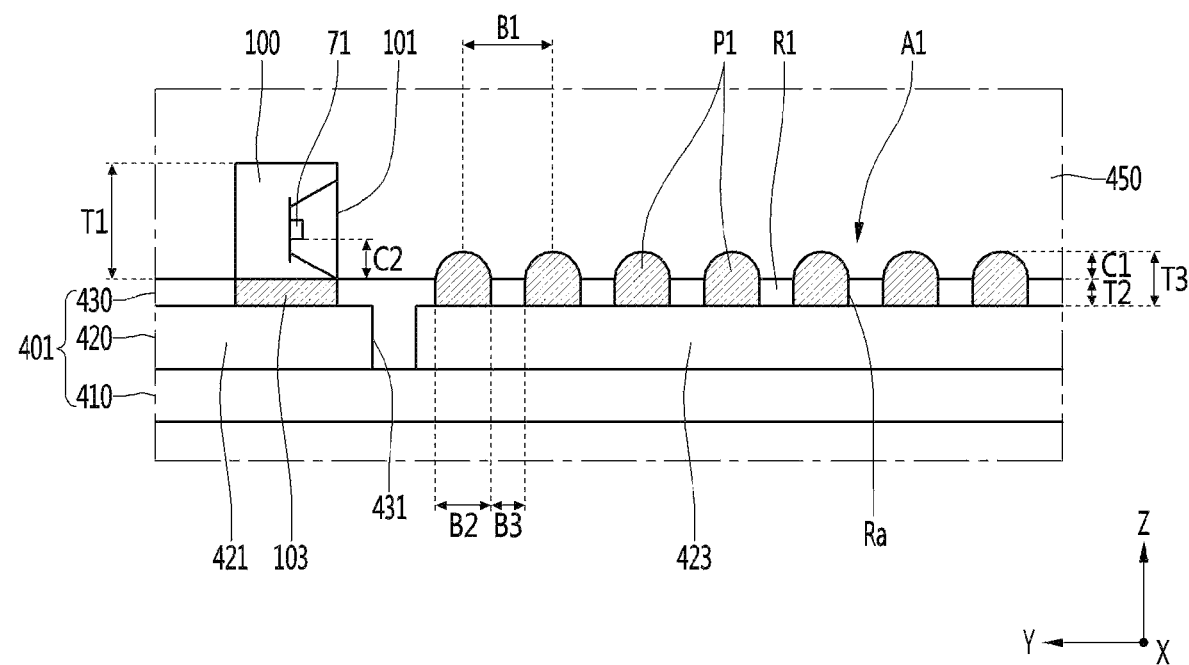
FIG. 3 is a partially enlarged view of the lighting device of FIG. 2.
Figure 4:
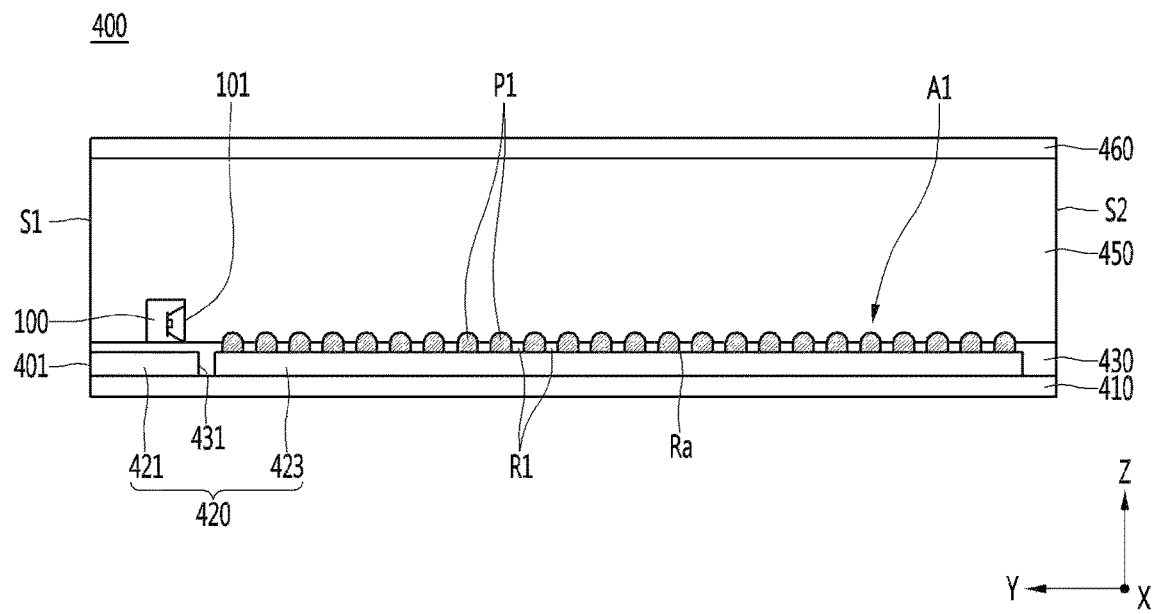
FIG. 4 is an example in which a diffusion layer is disposed on the lighting device of FIG. 2.

FIG. 1 is a plan view showing a lighting device according to an embodiment of the invention, FIG. 2 is a cross-sectional view taken along A-A side of the lighting device of FIG. 1, FIG. 3 is a partially enlarged view of the lighting device of FIG. 2, and FIG. 4 is an example in which a diffusion layer is disposed on the lighting device of FIG. 2.

Referring to FIGS. 1 to 4, a lighting device 400 includes a substrate 401, a light source 100 disposed on the substrate 401, a plurality of protrusions P1 arranged on the substrate

401, and a resin layer 450 disposed on the light source 100 and the protrusions P1. The lighting device 400 may emit light emitted from the light source 100 as a surface light source. The lighting device 400 may be a surface light source module or a lighting module. The upper surface of the substrate 401 has an X-axis and Y-axis plane, and a thickness of the substrate 401 may be a height in a Z-axis direction orthogonal to the X-axis and Y-axis. Here, the Y-axis direction is a direction in which light is emitted or a second direction, the X-axis direction is a first direction perpendicular to the Y-axis, and the Z-axis direction may be a third direction perpendicular to the X-axis and the Y-axis. The substrate 401 may be a non-flexible substrate or a flexible substrate.

The light source 100 may be arranged on the substrate 401 in a first direction X. The light source 100 may be arranged along at least one side of the side surfaces of the substrate 401. The lighting device 400 includes a reflective region A1 on the substrate 401, and the reflective region A1 may be disposed in an area of 80% or more of an upper surface area of the substrate 401. The protrusions P1 may be arranged in the reflective region A1, and the protrusions P1 may have a long length in the first direction X and may be arranged in the second direction. The reflective region A1 is disposed in a center region of the upper surface of the substrate 401, and an outer portion of the reflective region A1 is a region spaced apart from the side surfaces of the substrate 401, or may be extended to adjacent regions of at least on one side or both sides of the substrate. The reflective region A1 may be a region in which patterns such as the protrusion P1 are disposed. The protrusions P1 exposed on the substrate 401 may reflect light emitted through the light source 100. The reflective region A1 is disposed on the substrate 401 in a single or plural form. As another example, the number of the columns in which the light source 100 is arranged and the reflective region A1 may be arranged in one or plural. The lighting device 400 is provided in one or plural, and may be applied to various lamp devices that require lighting, such as car lamps, home lighting devices, industrial lighting devices, etc. For example, in the case of lighting modules applied to car lamps, there is applicable to head lamps, car lights, side mirror lights, fog lights, tail lamps, turn signal lamp, back up lamp, stop lamp, daytime running right, vehicle interior lighting, door scarf, rear combination lamp, etc.

Each component and operation of the lighting module according to an embodiment of the invention will be described.

<Substrate (401)>

As shown in FIGS. 1 to 4, the substrate 401 may include a printed circuit board (PCB), for example, a resin-based printed circuit board (PCB), a metal core (Metal Core) PCB, a flexible PCB, a non-flexible PCB, a ceramic PCB, or an FR-4 substrate. The substrate 401 may include one or two or more layers having a circuit pattern, and may include a PCB having a circuit pattern on one side or a PCB having a circuit pattern on both sides. A circuit pattern may be disposed on the substrate 401 in a region where the light source 400 is disposed and in a region surrounding the light source 400.

The length of the substrate 401 in the X direction and the length in the Y direction may be the same or different from each other. The thickness of the substrate 401 may be 1 mm or less, for example, in the range of 0.3 mm to 1 mm. The thickness of the lighting device 400 is a straight line distance from the lower surface of the substrate 401 to the upper surface of the resin layer 450, and may be 5.5 mm or less, for example, a range of 4.5 mm to 5.5 mm or a range of 4.5 mm to 5 mm. The thickness of the lighting device 400 may be 220% or less, for example, 180% to 220% of the thickness of the resin layer 450. When the thickness of the lighting device 400 is thinner than the above range, a hot spot may be generated due to a decrease in the light diffusion space, and when it is larger than the above-mentioned range, the module size may be reduced, and spatial installation may be restricted and design freedom may be reduced.

The substrate 401 may include an insulating layer 410, a metal layer 420 on the insulating layer 410, and a protective layer 430 on the metal layer 420. The insulating layer 410 may include at least one or two or more of epoxy resin, glass fiber, flame retardant, pre-impregnated materials, phenol resin, and unsaturated polyester resin. The substrate 401 may further include a metal support layer under the insulating layer 410 for heat dissipation. The metal layer 420 may be disposed on the insulating layer 410, and include at least one of Cu, Au, Al, and Ag, and may be provided in a single layer or multiple layers. The metal layer 420 may include, for example, Cu or Au/Cu. The metal layer 420 may include a first metal layer 421 and a second metal layer 423. In the metal layer 420, the first metal layer 421 and the second metal layer 423 may be electrically opened to each other. The first metal layer 421 and the second metal layer 423 may be physically separated. The first metal layer 421 may be disposed adjacent to the light source 100 or in a lower region of the light source 100. The first metal layer 421 functions as a wiring layer having a circuit pattern, and may be electrically connected to the light source 100. The first metal layer 421 may connect the plurality of light sources in series, parallel, or in series-parallel. The second metal layer 423 may be disposed under the reflective region in FIG. 1. The second metal layer 423 may include the same metal as the first metal layer 421. The upper surface area of the second metal layer 423 may be 50% or more or 70% or more of the upper surface area of the substrate 401. The second metal layer 423 may be electrically opened with the light source 100. The second metal layer 423 may be provided as a single plate under the reflective region A1. A top view shape of the second metal layer 423 may be polygonal. The upper surface of the second metal layer 423 may be disposed on the same plane as the upper surface of the first metal layer 421. The lower surface of the second metal layer 423 may be disposed on the same plane as the lower surface of the first metal layer 421. The thickness of the metal layer 420 may be 35 μm or more, for example, in a range of 35 to 70 μm or 35 to 100 μm. The thickness of the metal layer 420 may be formed to 35 μm or more for electrical conductivity and thermal conductivity, and may be provided to 100 μm or less in consideration of the thickness or ductility characteristics of the module.

The protective layer 430 may include a member having an insulating material or a solder resist material. The solder resist material is a white material and may reflect incident light. The protective layer 430 may protect the upper surfaces of the first metal layer 421 and the second metal layer 423 to prevent moisture infiltration and protect the surface. A portion of the protective layer 430 may be extended and disposed in the open region 431 between the first and second metal layers 421 and 423. The protective layer 430 may block contact or interference between the first and second metal layers 421 and 423. As another example, the protective layer 430 may include a black or green resist material. When the protective layer 430 is formed of a white material, light reflection efficiency may be improved, and in the case of a black material, visibility or clarity of light may be improved. As shown in FIG. 3, the thickness T2 of the protective layer 430 may be thinner than the thickness of the metal layer 420, and may be 30 μm or less, for example, in a range of 15 to 30 μm.

As shown in FIG. 3, the first metal layer 421 and the second metal layer 423 may be disposed between the insulating layer 410 and the protective layer 430. The first metal layer 421 may be exposed through the open region of the protective layer 430 and connected to the light source 100 by a bonding member. The second metal layer 423 includes an opening portion Ra, and a portion of the protective layer 430 may be opened in the opening portion Ra. The plurality of the opening portions Ra may be spaced apart from each other. The plurality of opening portions Ra may be spaced apart from each other in the second direction. Each of the opening portions Ra may have a long length in the first direction X. The length direction of the opening portion Ra is the first direction X and may be a direction in which the plurality of light sources 100 are arranged. The width of the opening portion Ra in the second direction may be 300 μm or less, for example, in the range of 100 to 150 μm or in the range of 100 to 300 μm. The plurality of the opening portions Ra are arranged in the second direction, and may have a length of 50% or more, for example, 70% or more, of the length of the substrate 401 in the first direction. The distance between the plurality of opening portions Ra arranged in the second direction may be constant, or may gradually decrease as the distance from the light source 100 increases. The protective layer 430 may include a plurality of reflective portions R1 disposed between the opening portion Ra and the opening portion Ra. The plurality of reflective portions R1 are respectively disposed between the opening portions Ra arranged in the first direction, and may have a long length in the first direction. The plurality of reflective portions R1 are connected from the protective layer 430 and may be formed of the same material as the protective layer 430. The upper surface of the reflective portion R1 may have a horizontal surface. The reflective portion R1 may have the upper surface lower than the upper surface of the protrusion P1 and may be in contact with the resin layer 450.

The light source 100 and the resin layer 450 may be disposed on the substrate 401. The substrate 401 may function as a base member or a support member located at the base of the light source 100 and the resin layer 450.

<Light Source (100)>

Referring to FIGS. 1 and 3, the light source 100 is disposed on the substrate 401 and may be sealed by the resin layer 450. The light source 100 may be disposed on the substrate 401 and embedded in the resin layer 450. The light source 100 is disposed adjacent to at least the first side surface S1 of the side surfaces of the resin layer 450 and emits light in a direction opposite to the first side surface S1. Since the light source 100 is spaced from the first side surface S1, it may provide a long inflow path of moisture. As shown in FIG. 1, the light source 100 may be spaced apart from the reflective region A1.

Figure 7:
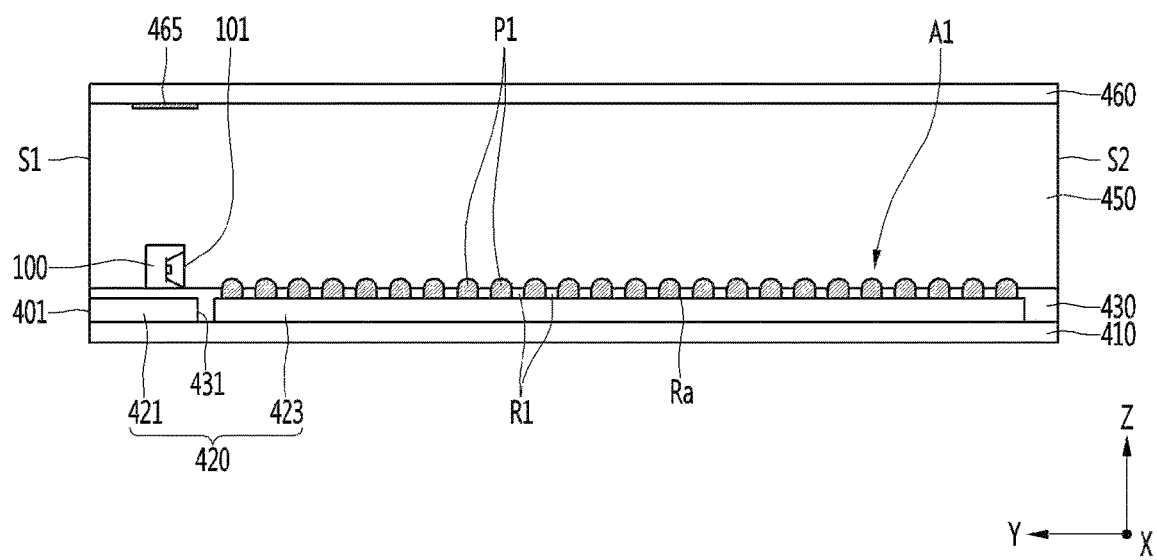
FIG. 7 is a third modified example of the lighting device of FIG. 4.
Figure 8:
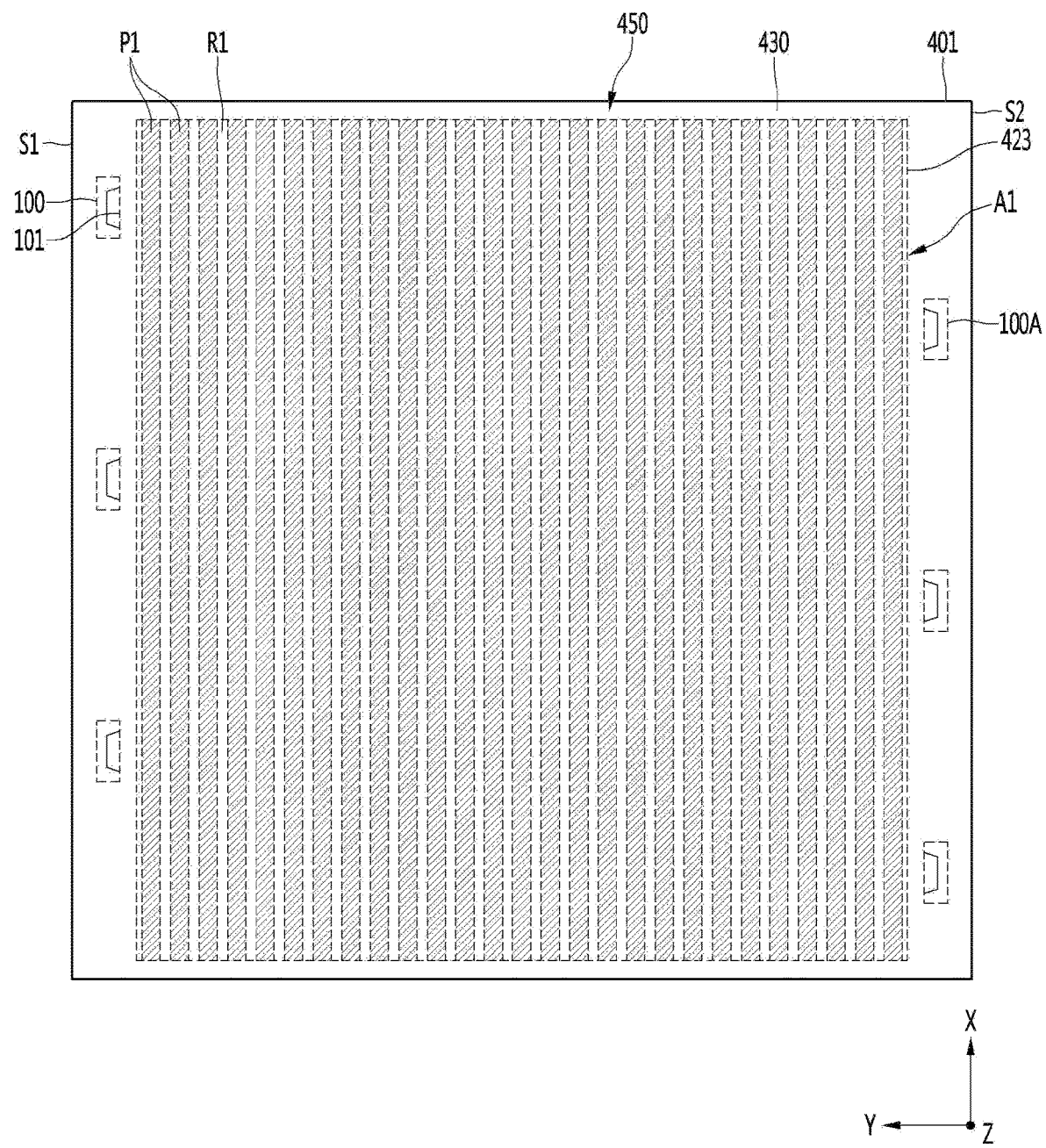
FIG. 8 is an example in which light sources are arranged on both sides of the lighting device of FIG. 1.

As another example, as shown in FIG. 8, it may include the first light source 100 adjacent to the first side surface of the substrate 401 and the second light source 100A adjacent to the second side surface S2 opposite to the first side surface S1. The first and second light sources 100 and 100A may be disposed in regions that do not face each other. For example, the second light source 100A may be disposed to face a region between the plurality of second light sources 100. The distance between the first light sources 100 may be the same as or different from the distance between the second light sources 100A. The first and second light sources 100 and 100A are arranged in a zigzag form on the substrate 401, and may improve the luminosity of the entire region. The first light source 100 disclosed in FIG. 8 may be the light sources of FIGS. 1 to 7.

As shown in FIGS. 2 and 3, the light source 100 may have an exit surface 101 through which light is emitted, and the exit surface 101 may be, for example, in the direction of a Z-axis with respect to a plane horizontal to the substrate 401. The exit surface 101 may be exposed in a direction opposite to the first side surface S1 of the resin layer 450 among the side surfaces of the light source 100. The exit surface 101 may be a plane perpendicular to the top surface of the substrate 401 or may include a curved surface concave in a direction of the first side surface S1. The exit surface 101 is a surface of a layer from which light is emitted from the light source 100, and the layer from which light is emitted may be formed of a resin material or a glass material.

The exit surface 101 of the light source 100 may be disposed on at least one side of the light source 100. The exit surface 101 may be a surface at least partially facing or corresponding to the second side surface S2 of the resin layer 450 among the side surfaces of the light source 100. The exit surface 101 may correspond to the second side surface S2 of the resin layer 450 between the lower surface and the upper surface of the light source 100. The exit surface 101 of the light source 100 may be a side surface adjacent to the protrusion P1 or a surface perpendicular to the upper surface of the protective layer 430. Light emitted through the exit surface 101 of the light source 100 may be emitted through the resin layer 450. The optical axis of the light source 100 may be an axial direction extending in a horizontal direction from the center of the exit surface 101, and light emitted from the light source 100 may emit with a predetermined directivity angle characteristic based on the optical axis.

As shown in FIG. 3, the thickness T1 of the light source 100 may be, for example, 2 mm or less, for example, 1 mm or less. The length of the light source 100 in the X-axis direction may be 1.5 times or more of the thickness T1 of the light source 100, and the width in the Y-axis direction may be smaller than the length in the X-axis direction. Looking at the distribution of the directivity of the light source 100, the light directing angle in the ±X axis direction may be wider than the light directing angle in the ±Z axis direction based on the horizontal straight line Y0. The light directing angle in the ±X-axis direction of the light source 100 may have a range of 110 degrees or more, for example, in a range of 120 degrees to 160 degrees or 140 degrees or more. The light directing angle in the ±Z-axis direction of the light source 100 may have a range of 110 degrees or more, for example, in a range of 110 degrees to 160 degrees.

The light source 100 may be arranged on the substrate 401 in one row or two or more rows. The light source 100 may be arranged in the X-axis direction.

The light source 100 is a device having a light emitting chip 71, for example, a light emitting diode (LED) chip (hereinafter referred to as a light emitting chip), and may include a package in which the light emitting chip is packaged. The light emitting chip 71 may emit at least one of blue, red, green, ultraviolet (UV), and infrared light. The light source 100 may emit at least one of white, blue, red, green, and infrared rays. The light source 100 may be a side view type electrically connected to the substrate 401. As another example, the light source 100 may include a light emitting chip, for example, in the form of a chip on board (COB). The light source 100 may include a molding member 81 (see FIG. 11) covering the light emitting chip 71. The molding member may include a phosphor. The light emitting chip 71 may emit blue light of 400 to 470 nm, and the phosphor may wavelength convert a part of the light emitted from the light emitting chip 71. The phosphor may include at least one of blue, green, yellow, or red phosphors.

<Protrusion (P1)>

The protrusion P1 may be disposed on the opening portion Ra of the metal layer 420. The protrusion P1 may include a metallic protrusion. The protrusion P1 may include one material or two or more alloys selected from the group including Ag, Au, Pt, Sn, Cu, Zn, In, Bi, Ti, and the like. The protrusion P1 may be bonded or combined with the second metal layer 423. The protrusion P1 may be a metal, alloy, or metallic material. The protrusion P1 may include solder paste. The solder paste may be formed by mixing powder particles or particle particles and flux. The solder paste may include at least one of Ag—Sn-based, Cu—Sn-based, Au—Sn-based, or Sn—Ag—Cu-based. The weight percentage of each metal in the material of the solder paste may be different. When the protrusion P1 is formed of a solder paste material, when formed on the second metal layer 423 through the opening portion Ra on the substrate 401, printability and wettability may good and a generation of voids may be reduced. The material of the protrusion P1 may be different from that of the metal layer 420. The protrusion P1 is formed of a liquid material and hardened on the opening portion Ra of the protective layer 430, and the surface of the protrusion may be formed in a curved shape by surface tension when cured.

According to an embodiment of the invention, even when a separate reflective film is not used on the substrate 401, light reflection efficiency may be improved through a reflective pattern using the protrusions P1. In addition, since the reflective film is removed, the process of attaching the reflective film with an adhesive may be reduced, and various problems caused by the adhesive may be reduced. In addition, the thickness of the lighting device 400 may be reduced due to the removal of the reflective film and the adhesive, and various shapes of the opening portion Ra due to the etching of the protective layer 430 may be provided.

The protrusion P1 may be disposed on the second metal layer 423. The protrusion P1 may have a long length in the first direction. The plurality of the protrusions P1 are arranged in the second direction, and may be disposed at a length of 50% or more, for example, 70% or more, of the length of the substrate 401 in the first direction. Each protrusion P1 may be provided in a stripe shape, or may include a straight or curved bar. The protrusion P1 reflects light emitted from the light source 100. The protrusion P1 and the reflective portion R1 may be alternately arranged in the second direction. The highest upper surface of the protrusion P1 may be disposed higher than the upper surface of the reflective portion R1. The material of the protrusion P1 may have a higher reflection characteristic than the material of the reflective portion R1. The protrusion P1 may be disposed between the plurality of light sources 100 and the second side surface S2 of the resin layer 450. The protrusion P1 may be disposed between the exit surface 101 of the plurality of light sources 100 and the second side surface S2 of the resin layer 450. The plurality of protrusions P1 may be arranged in a direction parallel to the direction in which the plurality of light sources 100 are arranged. The protrusion P1 may be disposed in the light emission direction of the plurality of light sources 100. As shown in FIG. 8, the plurality of protrusions P1 may be disposed between the light sources 100 and 100A opposite to each other.

The protrusion P1 may protrude higher than the upper surface of the protective layer 430 toward the upper surface of the resin layer 450. The protrusion P1 and the reflective portion R1 may contact the upper surface of the second metal layer 423. The protrusion P1 is disposed higher than the reflective portion R1 to effectively reflect the incident light. The upper portion of the protrusion P1 includes a convex curved surface shape, and the convex curved surface shape may protrude higher than the upper surface of the reflective portion R1 or the upper surface of the opening portion Ra. The convex curved surface may diffuse incident light.

As illustrated in FIG. 1, an area of entire upper surface of the protrusion P1 in the reflective region A1 may be larger than an area of the upper surface of the reflective portion R1. The reflective region A1 may be an upper surface region of the second metal layer 423 or an inner region of a region in which the outermost points of the protrusions P1 are connected to each other. As shown in FIG. 3, the upper surface of the protrusion P1 may be disposed higher than the upper surface of the protective layer 430 and lower than the position of the light emitting chip 71 inside the light source 100. When the upper surface of the protrusion P1 protrudes beyond the position of the light emitting chip 71, the diffusion efficiency of light may be lowered, and when it is lower than the upper surface of the protective layer 430, the reflection efficiency of light may be lowered. The interval C2 between the light emitting chip 71 and the protective layer 430 may be 460 μm or less based on the upper surface of the protective layer 430. The thickness or height T3 of the protrusion P1 may be greater than the thickness T2 of the protective layer 430 and lower than the interval C2 between the light emitting chip 71 and the protective layer 430. The height difference C1 between the protrusion P1 and the protective layer 430 may be smaller than the interval C2 between the protective layer 430 and the light emitting chip 71. The difference C1 is the height at which the protrusion P1 protrudes based on the protective layer 430, and may be in the range of 10 to 400 μm.

The width B2 of the protrusion P1 may be wider than the widths B3 (e.g. B2>B3) of the reflective portion R1. The width B2 of the protrusion P1, for example, the width of the lower surface of the protrusion P1 may be 100 μm or more, for example, in the range of 100 to 300 μm, or in the range of 100 to 150 μm. The interval B1 between the protrusions P1 may be constant, for example, may be 110 μm or more. The ratio B2:B3 of the width B3 of the reflective portion R1 and the width B2 of the protrusion P1 may be in the range of 1:1.5 to 1:10 or 1:1.5 to 1:5. When the width B2 of the protrusion P1 is at least 1.5 times or more than the width B3 of the reflective portion R1, there may be an effect of improving the reflection efficiency of light. The width B3 of the reflective portion R1 may be 8 μm or more, for example, in the range of 8 to 30 μm. When the width B3 of the reflective portion R1 is less than 8 μm, adhesive strength may be deteriorated and shape maintenance of the protrusion P1 may be difficult, and when it is larger than the width, the reflective area of light may be reduced.

<Resin Layer 450>

The resin layer 450 may be disposed on the substrate 401. The resin layer 450 may be disposed on all or part of the upper surface of the substrate 401. The area of the lower surface of the resin layer 450 may be equal to or smaller than the area of the upper surface of the substrate 401. Each side surface of the resin layer 450 may be disposed on the same plane as each side surface of the substrate 401. The resin layer 450 may contact the protrusion P1 and the protective layer 430 of the substrate 401. The resin layer 450 may contact the surface of the light source 100 and may contact the exit surface 101. The upper surface of the resin layer 450 may be a flat surface or a rough surface having an uneven shape. A portion of the resin layer 450 may be disposed between the protrusions P1, respectively. The resin layer 450 may contact the reflective portion R1 between the protrusions P1. The resin layer 450 may contact the convex curved surface of the protrusion P1 and the flat upper surface of the reflective portion R1.

The resin layer 450 may be formed of a transparent material. The resin layer 450 may include a resin material such as silicone or epoxy. The resin layer 450 may include a thermosetting resin material, and may optionally include PC, OPS, PMMA, PVC, and the like. The resin layer 450 may be formed of glass. For example, as the main material of the resin layer 450, a resin material using urethane acrylate oligomer as a main raw material may be used. The resin layer 450 may be a synthetic oligomer, a urethane acrylate oligomer, and a polyacrylic polymer type. Of course, it may further include a mixed monomer the low-boiling dilution type reactive monomers such as IBOA (isobornyl acrylate), HPA (Hydroxypropyl acrylate, 2-HEA (2-hydroxyethyl acrylate), etc.) may further include a mixed monomer, and as an additive, a photoinitiator (for example, 1-hydroxycyclohexyl phenyl-ketone, etc.) or antioxidants may be mixed.

A bead (not shown) may be included in the resin layer 450, and the bead may diffuse and reflect incident light, thereby increasing the amount of light. The beads may be disposed in a range of 0.01 to 0.3% by weight of the resin layer 450. The resin layer 450 may include a phosphor. The phosphor may include at least one of blue, green, yellow, or red phosphors.

Since the resin layer 450 is disposed on the light source 100, the light source 100 may be protected and loss of light emitted from the light source 100 may be reduced. The resin layer 450 may prevent moisture penetration by sealing the surface of the light source 100. The lower portion of the resin layer 450 may be disposed between the protrusions P1. The lower portion of the resin layer 450 may contact the upper surface of the reflective portion R1 through between the protrusions P1. Accordingly, the lower portion of the resin layer 450 is in contact with the substrate 401, thereby fixing the protrusion P1 between the resin layer 450 and the substrate 401.

The resin layer 450 may include first and second side surfaces S1 and S2 having a long length in the first direction. The first and second side surfaces S1 and S2 may be opposite sides to each other in the second direction. The first side surface S1 is adjacent to the light source 100 and may face the rear surface of the light source 100. The front surface of the light source 100 may be an exit surface 101, and the rear surface may be a surface opposite to the front surface. The first side surface S1 may be a surface opposite to the exit surface 101 of the light source 100. The second side surface S2 is a surface facing the first side surface S11 and may face the exit surface 101 of the light source 100. Side surfaces orthogonal to the first and second side surfaces S1 and S2 of the resin layer 450 are opposite surfaces to each other, and may be disposed on both sides in the longitudinal direction of the protrusion P1.

The resin layer 450 may be provided with the same thickness depending on the region. The thickness in the Z-axis direction of the resin layer 450 may be thicker than the thickness T1 of the light source 100. As another example, the resin layer 450 may have a different thickness depending on the region, for example, a thickness of the region adjacent to the first side surface S1 of the resin layer 450 may be thicker than a thickness the region adjacent to the second side surface S2. The thickness of the resin layer 450 may be more than the thickness of the light source 100 and may be 5 mm or less. The thickness of the resin layer 450 may range from 1.7 mm to 5 mm. When the thickness of the resin layer 450 is larger than the above range, light efficiency may decrease or the module thickness may increase, and when it is smaller than the above range, light uniformity may decrease. when the thickness of the resin layer 450 is thick, there is a problem that a flexible module or device cannot be implemented or applied. The size of the resin layer 450 may be provided in a size in consideration of light uniformity, and may vary depending on an application. The top view shape of the resin layer 450 may be a polygonal shape, for example, a quadrangular shape, a curved shape, or a bent shape. Metal materials such as aluminum, chromium, and barium sulfate may be coated on each side surface of the resin layer 450, and light reflection characteristics may be improved.

The upper surface of the resin layer 450 according to an embodiment of the invention may be an exit surface. The exit surface of the resin layer 450 may be a flat surface, or may include a light extraction structure (or an optical pattern or an uneven pattern) in some regions. The light extraction structure may include an uneven pattern, and may reflect or transmit incident light or change a critical angle. The light extraction structure may be integrally formed on the exit surface of the resin layer 450. The resin layer 450 and the light extraction structure may be formed of the same material. The light extraction structure may have a pattern at regular intervals or irregular intervals.

In an embodiment of the invention, the lighting device 400 may guide the light of the light source 100 through the resin layer 450 to provide a uniform surface light source in the Z-axis direction. According to an exemplary embodiment of the invention, the plurality of protrusions P1 may be disposed between the resin layer 450 and the substrate 401 to improve light reflection efficiency. Since the material of the protrusion P1 is formed of a metallic or reflective material, it is possible to provide light efficiency and light distribution characteristics suitable for various types of lamps applied to an object such as a vehicle. Since the lighting device 400 provides a surface light source using the reflective region having the protrusions P1, it may be applied to a daytime running right, a backup lamp, a turn signal lamp, etc.

The lighting device 400 according to an embodiment of the invention may provide a pattern of the light extraction structure on the exit surface of the resin layer 450 to improve light efficiency, increase center luminosity, and provide a surface light source. The light extraction structure may improve light convergence and diffusivity by the pattern. An embodiment of the invention may provide the reflective pattern in which the plurality of protrusions P1 are arranged on the substrate 401 to remove the reflective film. According to an embodiment of the invention, a thickness of a member having the protrusions P1 or a height of an upper surface thereof may be reduced by disposing the plurality of metallic protrusions P1 on the substrate 401 in the opening portion Ra of the protective layer 430 and a thickness of a member having the protrusions P1 or a height of an upper surface thereof may be reduced. According to an embodiment of the invention, adhesion of a member having the protrusions P1 may be improved by bonding a plurality of metallic protrusions P1 on the second metal layer 423 of the substrate 401.

According to an embodiment of the invention, a separate curved surface treatment process may not be performed on the surface of the protrusion P1 by forming the protrusion P1 in a liquid state and curing it.

Describing the manufacturing method of the lighting device, it may include the steps of providing a substrate 401 on which the first and second metal layers 421 and 423 and the protective layer 430 are disposed, forming a plurality of opening portions Ra with respect to a reflective region A1 on which the protective layer 430 is disposed, forming a protrusion P1 in the second metal layer 423 through the opening portions Ra and protruding higher than the upper surface of the protective layer 430, forming a light source 100 on the first metal layer 421, and forming a resin layer 450 on the substrate 401 on which the protrusion P1 and the light source 100 are disposed. The opening portion Ra may open the protective layer 430 in a stripe shape in the first direction, expose the second metal layer 423, and may be arranged in a plurality in the second direction. As another example, the step of forming a diffusion layer 460 on the resin layer 450 may be further included.

FIG. 4 is a first modified example of the lighting device of FIGS. 2 and 4. In describing FIG. 4, the configuration disclosed above may be selectively applied, and a description overlapping with the above description will be omitted.

Referring to FIG. 4, the lighting device 400 according to an embodiment of the invention may include a diffusion layer 460. The diffusion layer 460 may be disposed on the resin layer 450. The diffusion layer 460 may be contacted or adhered to an upper surface of the resin layer 450. The diffusion layer 460 may be disposed on the entire upper surface of the resin layer 450. The diffusion layer 460 may be cured after the resin layer 450 is cured and then formed of a resin material having a diffusion agent. Here, the diffusion agent may be added in a range of 1.5 wt % to 2.5 wt % based on the amount of the diffusion layer 460 in the process. The diffusion layer 460 may be a transparent resin material, for example, a resin material such as UV (Ultra violet) resin, epoxy or silicone. The refractive index of the diffusion layer 460 may be 1.8 or less, for example, in the range of 1.1 to 1.8 or in the range of 1.4 to 1.6, and may be lower than the refractive index of the diffusion agent.

The UV resin, for example, may use as a main material a resin (oligomer type) having urethane acrylate oligomer as a main raw material. For example, urethane acrylate oligomer, which is a synthetic oligomer, may be used. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxy-cyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photoinitiator to be able to perform a function of initiating photoreactivity, and may be formed of a mixture capable of improving yellowing by adding 0.5 to 1% of an antioxidant. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

The resin layer 450 and the diffusion layer 460 may be made of the same resin material. Since the resin layer 450 and the diffusion layer 460 are in close contact with each other with the same resin material, light loss at the interface between the resin layer 450 and the diffusion layer 460 may be reduced. When the refractive index of the resin material of the resin layer 450 and the diffusion layer 460 is 1.4 or more at the light emission wavelength, it may be seen that the uniformity of light is 90% or more. The refractive index of such a resin material may be in a range of 1.8 or less, for example, 1.1 to 1.8, or 1.4 to 1.6, and may be lower than the refractive index of the diffusing agent. When the refractive index of the resin material of the resin layer 450 and the diffusion layer 460 is in the range of 1.1 to 1.8, it may be that the light efficiency is 95% or more.

The diffusion layer 460 may be formed to a thickness thinner than that of the resin layer 450. The thickness of the diffusion layer 460 may be 80% or less, for example, in a range of 40% to 80% of the thickness of the resin layer 450. Since the diffusion layer 460 is provided with a thin thickness, ductility characteristics of the lighting module may be secured. The diffusion layer 460 may be provided in a single layer or multilayer structure. The diffusion layer 460 may include beads or dispersing agents therein. The diffusing agent has a refractive index in the range of 1.4 to 2 at the emission wavelength, and a size of the agent may be in the range of 4 to 6 μm. The diffusion agent may be spherical, but is not limited thereto. when the refractive index of the diffusing agent is 1.4 or more, for example, 1.4 to 2, the uniformity of light may be 90% or more, and when the size of the diffusing agent is in the range of 4 to 6 μm, the uniformity of light may be 90% or more.

The diffusion layer 460 may diffuse light incident through the resin layer 450 by the diffusion agent. Accordingly, generation of hot spots due to light emitted through the diffusion layer 460 may be reduced. The diffusion agent may have a size larger than a wavelength of light emitted from the light source 100. Since such a diffusing agent has a size larger than that of the wavelength, the light diffusion effect may be improved. A content of the diffusing agent may be in a range of 5 wt % or less, for example, 2 to 5 wt % in the diffusion layer 460. When the content of the diffusing agent is smaller than the range, there is a limit to lowering hot spots. When the content is larger than the range, light transmittance may be deteriorated. Therefore, the diffusing agent is disposed in the diffusion layer 460 in the above-described content, and thus light may be diffused to reduce hot spots without deteriorating the light transmittance. In the lighting module according to an embodiment of the invention, a phosphor may be added to at least one of the resin layer 450 and the diffusion layer 460. The phosphor is disposed on the resin layer 450, for example, may include at least one of a red phosphor, a yellow phosphor, a green phosphor, or a white phosphor.

Figure 5:
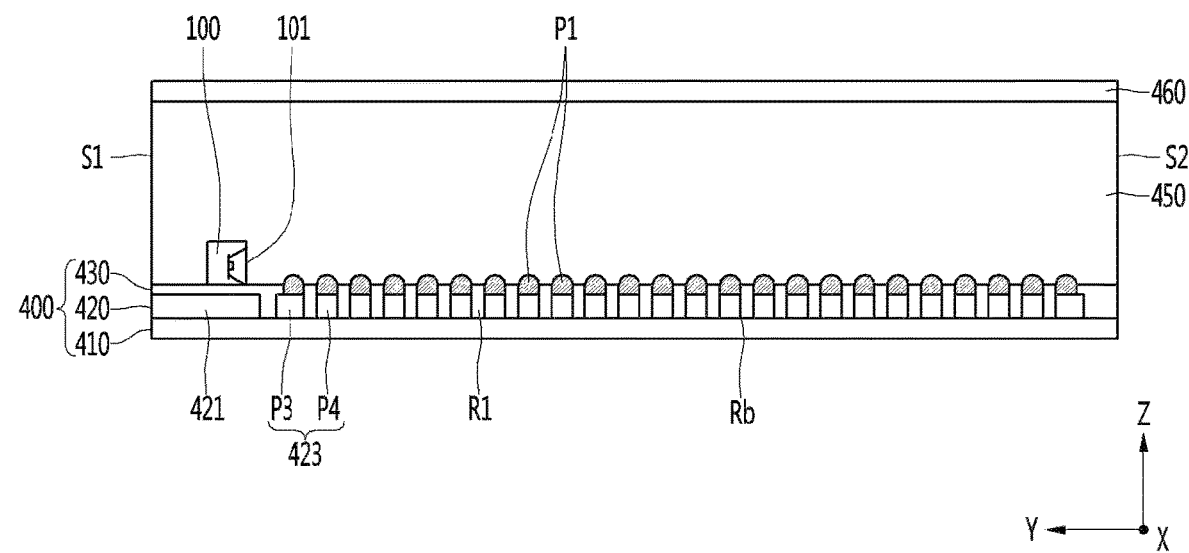
FIG. 5 is a first modified example of the lighting device of FIG. 4.

FIG. 5 is a second modified example of the lighting device of FIGS. 2 and 4. In describing FIG. 5, the above-described configuration may be selectively applied, and a description overlapping with the above description will be omitted.

Referring to FIG. 5, in the lighting device according to an embodiment of the invention, the substrate 400 may include a metal layer 420 having a plurality of supports P3 and P4. The metal layer 420 includes first and second metal layers 421 and 423, and a plurality of light sources 100 arranged in a first direction are disposed on the first metal layer 421, and a plurality of protrusions P1 may be disposed on the second metal layer 423.

The second metal layer 423 may be provided as a plurality of second metal layers separated from each other. That is, the second metal layer 423 may include a plurality of separated support portions P3 and P4 or a plurality of second metal layers. The second metal layer 423 may be formed of a plurality of support portions P3 and P4 separated from each other, and each of the plurality of support portions P3 and P4 may correspond to the protrusion P1.

The plurality of support portions P3 and P4 may include a first support portion P3 spaced apart from the first metal layer 421 and a second support portion P4 spaced apart from the first support portion P3. For convenience of description, the first support portion P3 adjacent to the first metal layer 421 may be equal to or larger than the size or width of another second support portion P4. The plurality of the second support portions P4 may be disposed spaced apart from each other. The first and second support portions P3 and P4 may be formed to have the same thickness as the first metal layer 421. A portion of the protective layer 430 may be extended and disposed in the opening portion Rb between the first and second support portions P3 and P4 or between the second support portions P4. The protrusions P1 may be disposed on the first and second support portions P3 and P4, respectively. The protrusions P1 may be disposed on the first and second support portions P3 and P4, respectively, and may protrude higher than the upper surface of the protective layer 430. The protrusion P1 will be referred to the description disclosed above. The first support portion P3 and the second support portion P4 may face or contact the lower surface of the protrusion P1. The widths of the first support portion P3 and the second support portion P4 is the length of the second direction in FIG. 1, or the width of the first support portion P3 is equal to or greater than that of the second support portion P4. The length of the first support portion P3 and the second support portion P4 is the length of the first direction, and may be the same or different from each other.

In the exemplary embodiment of the invention, since the second metal layer 423 is disposed with the plurality of support portions P3 and P4, flexible characteristics of the module or the substrate 401 may be improved. Since a part of the protective layer 430 is disposed between the support portions P3 and P4 of the second metal layer 423, the height of the upper surface of the protective layer 430 may be lower than a height of an upper surface of the protective layer 430 in a region where the light source 100 is disposed. Accordingly, even when the height of the protrusions P1 is not increased, there is an effect of ensuring a difference in height between the top surface of the protrusions P1 and the upper surface of the protective layer 430.

Figure 6:
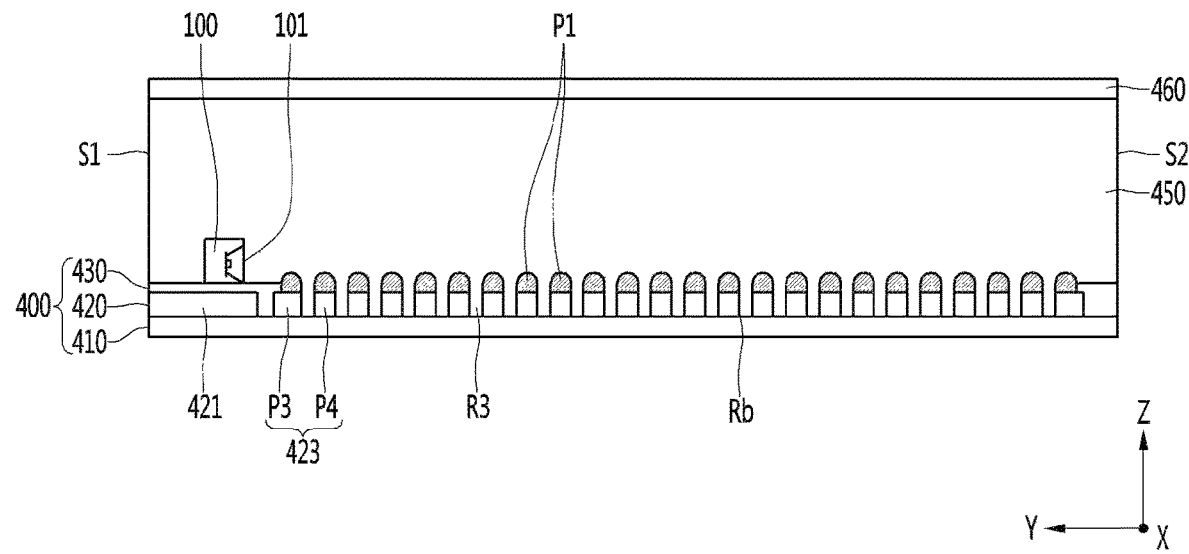
FIG. 6 is a second modified example of the lighting device of FIG. 4.

FIG. 6 is a third modified example of the lighting device of FIGS. 2 and 4. In describing FIG. 6, the configuration disclosed above may be selectively applied, and a description overlapping with the above description will be omitted.

Referring to FIG. 6, in a lighting device according to an embodiment of the invention, the substrate 401 may include a metal layer 420 having a plurality of opening portions Rb and a plurality of support portions P3 and P4. The metal layer 420 includes first and second metal layers 421 and 423, and a plurality of light sources 100 arranged in a first direction are disposed on the first metal layer 421, and a plurality of protrusions P1 may be disposed on the second metal layer 423. The second metal layer 423 may include the plurality of support portions P3 and P4 and the plurality of opening portions Rb. The plurality of support portions P3 and P4 will be referred to the description of FIG. 5.

The plurality of opening portions Rb may be disposed between the plurality of support portions P3 and P4, respectively. The plurality of opening portions Rb may be regions in which portions of the protective layer 430 and the second metal layer 423 are removed. The height of the opening portion Rb may be an interval between an upper surface of the protective layer 430 and an upper surface of the insulating layer 410. A protrusion R3 of the resin layer 450 may be disposed in the opening portion Rb. The protrusion R3 of the resin layer 450 is disposed in the opening portion Rb, and may contact the side surfaces of the support portions P3 and P4 and the side surface of the protrusion P1. The lowest end of the resin layer 450 may be disposed lower than the lower surface of the protrusion P1. The lowest end of the resin layer 450 may be disposed lower than the upper surface of the second metal layer 423. The height of the protrusion R3 may be greater than the sum of the thickness of the metal layer 420 and the thickness of the protective layer 430. Since the protrusion R3 of the resin layer 450 extends in the second metal layer 423, flexible characteristic of the lighting device may be enhanced. In order to prevent light leakage through the protrusions R3 of the resin layer 450, a reflective layer or an absorbing layer may be disposed on the surface of the insulating layer 410. The insulating layer 410 may be a reflective material layer. As another example, a portion of the resin layer 450 may be disposed on the etched region of the second metal layer 423 by removing the second metal layer 423 by partial etching. That is, the etched region is a region between the support portions P3 and P4, and may range from 40% to 60% of the thickness of the support portions P3 and P4. The diffusion layer 460 according to an embodiment of the invention may have a single layer or a multi-layer structure on the resin layer 450. The distribution of the surface light source may be uniformly provided by the diffusion layer.

FIG. 7 is a fourth modified example of the lighting device of FIGS. 2 and 4. In describing FIG. 6, the configuration disclosed above may be selectively applied, and a description overlapping with the above description will be omitted.

Referring to FIG. 7, a lighting device according to an embodiment of the invention may include a light blocking portion 465 and a diffusion layer 460 on the resin layer 450.

The light blocking portion 465 may be disposed in a region corresponding to the light source 100 on the lower surface of the diffusion layer 460. The light blocking portions 465 may be respectively disposed on the light sources 100 of FIG. 1, or may be respectively disposed on the light sources 100 and 100A of FIG. 8. The light blocking portion 465 may be disposed on each of the plurality of light sources 100 or may be provided in a size that covers the plurality of light sources 100.

The light blocking portion 465 may be 50% or more, for example, in a range of 50% to 120% of the upper surface area of the light source 100 on each light source 100. The light blocking portion 465 may be formed through a region printed with a white material. The light blocking portion 465 may be printed using a reflective ink including any one of $TiO_2$, $Al_2O_3$ $CaCO_3$, $BaSO_4$, and Silicon. The light blocking unit 465 reflects the light emitted through the light exit surface of the light source 100 to reduce the generation of hot spots due to the light intensity of the light on the light source 100. The light blocking portion 465 may print a light blocking pattern using light blocking ink. The light blocking portion 465 may be formed in a manner printed on the lower surface of the diffusion layer 465. The light blocking portion 465 may block 100% of incident light and transmittance may be lower than reflectivity, thereby performing light as a function of light blocking and diffusion. The light blocking portion 465 may be formed in a single layer or multiple layers, and may have the same pattern shape or different pattern shapes. The light blocking portion 465 may be an air region. The size of the light blocking portion 465 may be arranged in a range of 50% or more, for example, in a range of 50% to 200% of the upper surface area of each of the light sources 100 to shield the incident light. Accordingly, hot spots on the region of the light source 100 may be reduced from the outside, thereby providing a uniform light distribution over the entire region.

FIG. 8 is another example of the lighting module of FIG. 1, the first light source 100 and the second light source 100A may be disposed on opposite sides of the substrate 401. The first and second light sources 100 and 100A may be disposed to be offset from each other. For example, the first and second light sources 100 and 100A may be arranged in a zigzag form. The light distribution may be uniformly provided in all regions by the first and second light sources 100 and 100A. The first and second light sources 100 and 100A are disposed on regions that do not face each other, so that it is possible to suppress a decrease in luminosity in regions opposite to the substrate 401.

Figure 9:
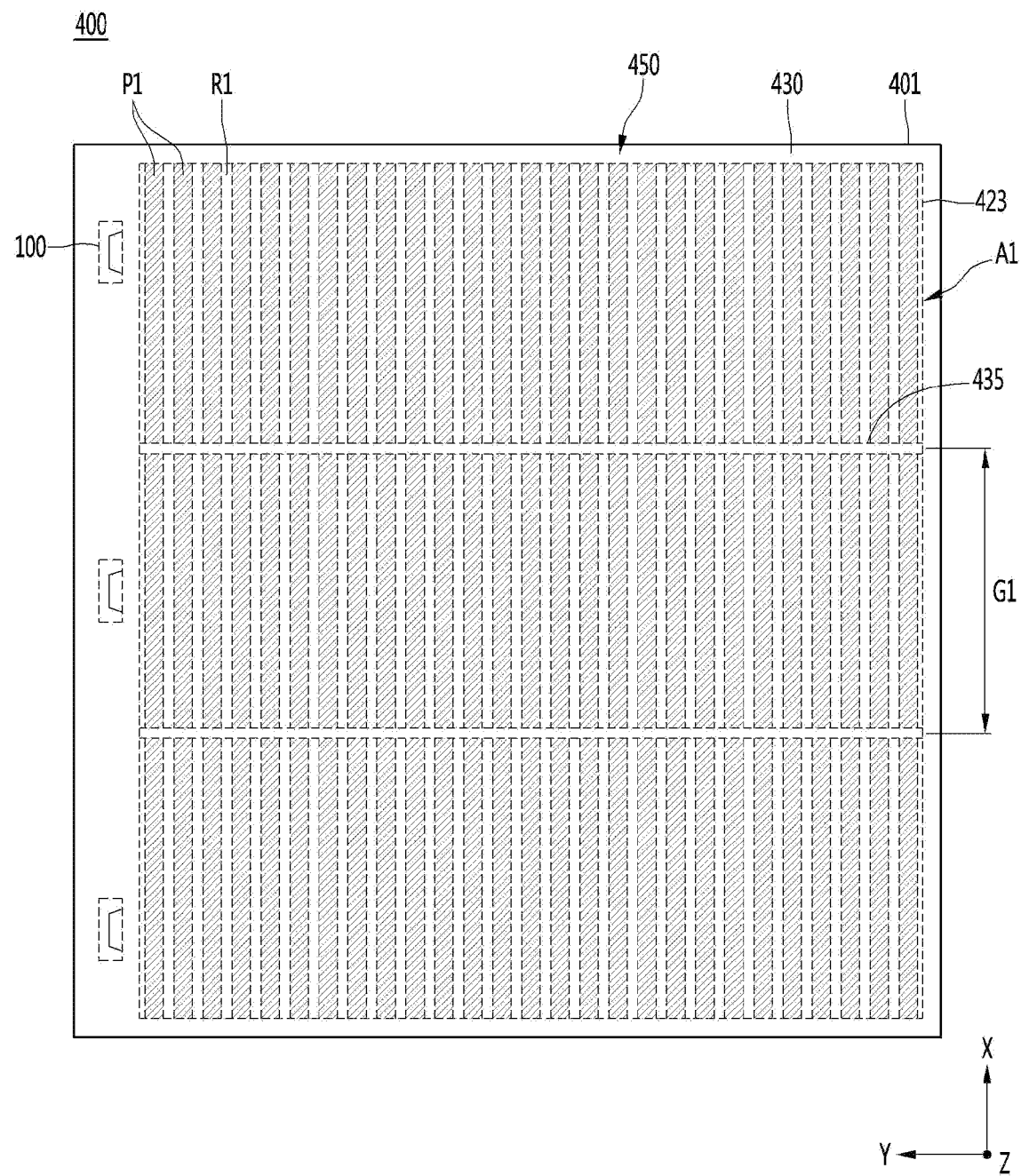
FIG. 9 is a view showing an example in which metallic protrusions of the lighting device of FIG. 1 are arranged in a matrix form.

FIG. 9 is another example of the lighting device of FIG. 1. Referring to FIG. 9, the plurality of protrusions P1 disposed on the substrate 401 may have a long length in the first direction. At this time, the plurality of protrusions P1 having a long length in the first direction may be spaced apart from each other. The separation portions 435 may be disposed between the protrusions P1 disposed in the first direction. The separation portions 435 may separate the protrusions P1 disposed in the first direction from each other. The interval between the separation portions 435 may be the same or greater than the interval between the light sources 100. The interval between the separation portions 435 may be 10 mm or less, for example, in a range of 5 mm to 10 mm. The separation portions 435 may be formed of the same material as the material of the protective layer 430, and may be connected to the plurality of reflective portions R1. The separation portion 435 may have a width in the first direction equal to the width of the reflective portion R1. The length of the separation portion 435 may be arranged in a long length between the plurality of protrusions P1 in the second direction.

In the exemplary embodiment of the invention, since the plurality of protrusions P1 of the lighting module are arranged in a long length, the separation portions 435 may be disposed between the protrusions P1 of the first direction. Also, the reflective portion R1 may be disposed between the protrusions P1 in the second direction. The separation portion 435 and the reflective portion R1 may be part of the protective layer 430. By using the protective layer 430 to be disposed around the second direction and the first direction of the protrusion P1, the protrusion P1 may be supported and protected and a decrease in light reflection efficiency may be prevented.

The lighting device or module according to the embodiment(s) disclosed above includes various types of vehicles such as head lamps, side mirror lights, fog lights, tail lamps, stop lamps, car lights, daytime running lights, etc. It may be applied to lighting devices, display devices, and traffic lights.

Figure 10:
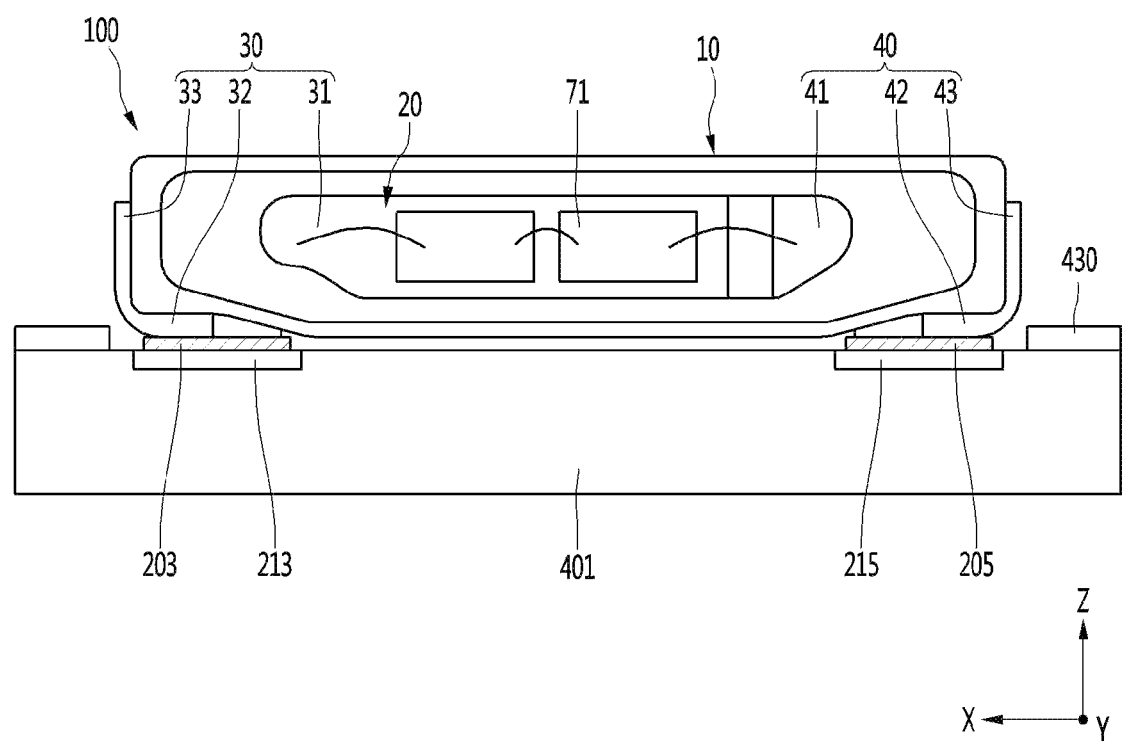
FIG. 10 is a view of the light source on the substrate viewed from the front in the lighting apparatus according to the embodiment of the invention.
Figure 11:
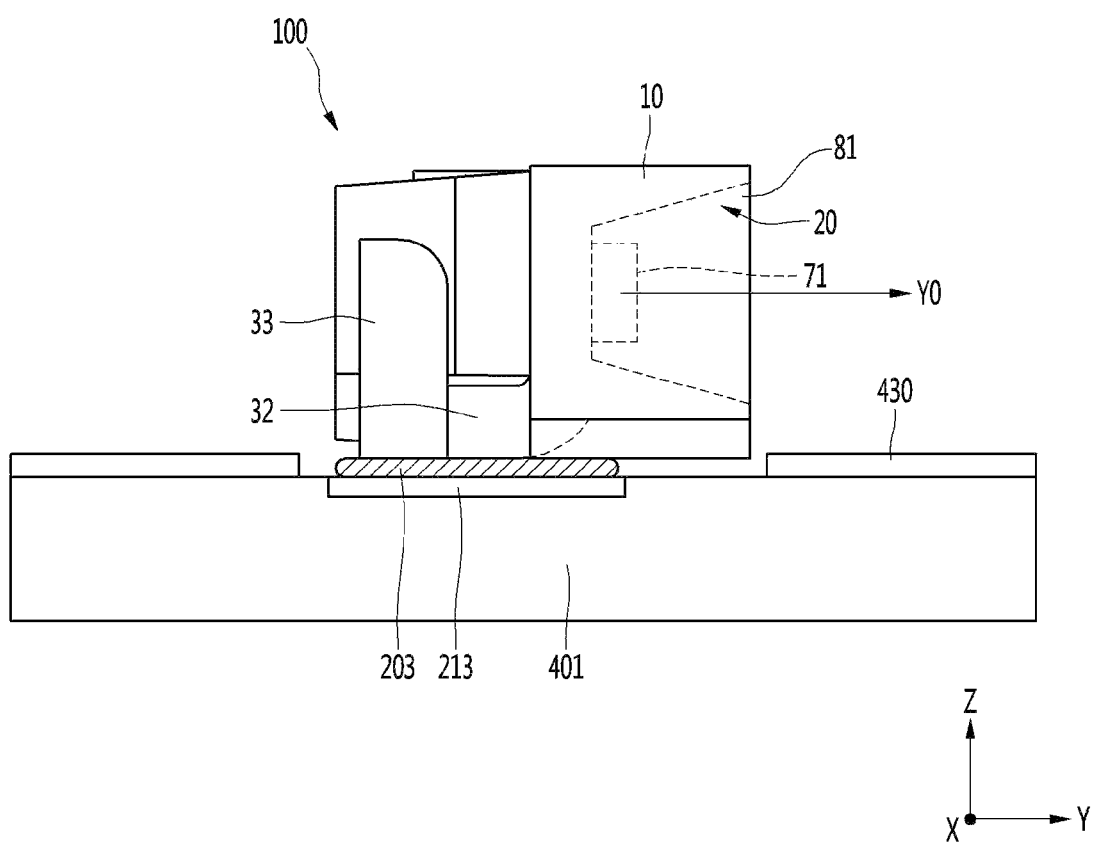
FIG. 11 is a side view of the light source on the substrate of FIG. 10.

FIG. 10 is a front view showing a light source of a lighting device according to an embodiment of the invention, and FIG. 11 is another side view of the lighting device of FIG. 10.

Referring to FIGS. 10 and 11, the light source 100 according to an embodiment of the invention includes a body 10 having a cavity 20, a plurality of lead frames 30 and 40 in the cavity 20, and a light emitting chip 71 disposed on at least one of the plurality of lead frames 30 and 40. The light source 100 may be implemented in a side view type package.

The light source 100 may have a length in the X-axis direction of three or more times, for example, four or more times the thickness in the Y-axis direction. The length in the X-axis direction may be 2.5 mm or more, for example, in a range of 2.7 mm to 4.5 mm. The light source 100 may provide a long length in the X-axis direction, thereby reducing the number of light source packages 100 when the light sources are arranged in the X-axis direction. The light source 100 may provide a relatively thin thickness, thereby reducing the thickness of the lighting module having the light source 100. The light source 100 may have a thickness of 2 mm or less.

The body 10 of the light source 100 is provided with a cavity 20 in which the lead frames 30 and 40 are exposed on the bottom thereof, and the body 10 may be coupled to the plurality of lead frames 30 and 40, for example, a first lead frame 30 and the second lead frame 40. The body 10 may be formed of an insulating material. The body 10 may be formed of a reflective material. The body 10 may be formed of a material having a reflectivity higher than a transmittance, for example, a material having a reflectance of 70% or more, for a wavelength emitted from a light emitting chip. When the reflectance is 70% or more, the body 10 may be defined as a non-transmissive material or a reflective material. The body 10 may be formed of a resin-based insulating material, for example, a resin material such as polyphthalamide (PPA). The body 10 may be formed of a silicone-based, epoxy-based, or heat-curable resin comprising a plastic material, or a high heat-resistant, high-light-resistant material. The body 10 includes a white-based resin. The body 10 may be formed of at least one selected from the group consisting of an epoxy resin, a modified epoxy resin, a silicone resin, a modified silicone resin, an acrylic resin, and a urethane resin. For example, a solid epoxy resin composition which is formed by adding an epoxy resin composed of triglycidyl isocyanurate, hydrogenated bisphenol A diglycidyl ether, etc. and an acid anhydride composed of hexahydrophthalic anhydride, 3-methylhexahydrophthalic anhydride, 4-methylhexahydrophthalic anhydride, etc. with 1,8-diazabicyclo (5,4,0) undecene-7 (DBU) as a curing agent, ethylene glycol as a co-catalyst, titanium oxide pigment, and glass fiber in the epoxy resin, partially curing by heating, and B staging may be used, and the present invention is not limited thereto. The body 10 may suitably mix at least one selected from the group consisting of a diffusion agent, a pigment, a fluorescent material, a reflective material, a light-shielding material, a light stabilizer, and a lubricant, in a thermosetting resin.

The body 10 may include a reflective material, for example, a resin material to which metal oxide is added, and the metal oxide may include at least one of $TiO_2$, $SiO_2$, and $Al_2O_3$. The body 10 can effectively reflect the incident light. As another example, the body 10 may be formed of a translucent resin material or a resin material having a phosphor that converts the wavelength of incident light.

Describing the side surfaces of the body 10, the body may include a front surface having a lower surface corresponding to the substrate 401, an upper surface opposite to the lower surface, and an emission surface through which light is emitted. The front surface of the body 10 may be provided as a horizontal upper surface and a vertical surface of the substrate 401.

The first lead frame 30 includes a first lead portion 31 disposed at the bottom of the cavity 20, a first bonding portion 32 disposed at a first outer region of the lower surface of the body 10, and a first heat dissipation portion 33 disposed on one side of the body 10. The first bonding portion 32 is bent from the first lead portion 31 in the body 10 and protrudes to the lower surface, and the first heat dissipation portion 33 may be bend from the first bonding portion 32.

The second lead frame 40 includes a second lead portion 41 disposed at the bottom of the cavity 20, a second bonding portion 42 disposed at a second outer region of the lower surface of the body 10, and a second heat dissipation portion 43 disposed on the other side of the body 10. The second bonding portion 42 is bent from the second lead portion 41 in the body 10, and the second heat dissipation portion 43 may be bent from the second bonding portion 42. The gap between the first and second lead portions 31 and 41 may be formed of a material of the body 10, and may be the same horizontal surface or protrude as the bottom of the cavity 20, but is not limited thereto.

Here, the light emitting chip 71 may be disposed, for example, on the first lead portion 31 of the first lead frame 30, or connected to the first and second lead portions 31 and 41 by wire, The first lead portion 31 may be connected with an adhesive and may be connected to the second lead portion 41 with a wire. The light emitting chip 71 may be a horizontal chip, a vertical chip, or a chip having a via structure. The light emitting chip 71 may be mounted in a flip chip method. The light emitting chip 71 may selectively emit light within a wavelength range of ultraviolet light to visible light. The light emitting chip 71 may emit, for example, ultraviolet or blue peak wavelengths. The light emitting chip 71 may include at least one of Groups II-VI compound and Groups III-V compound. The light emitting chip 71 may be formed of, for example, a compound selected from the group consisting of GaN, AlGaN, InGaN, AlInGaN, GaP, AlN, GaAs, AlGaAs, InP and mixtures thereof. In the light source 100, one or a plurality of light emitting chips 71 disposed in the cavity 20 may be disposed. The light emitting chip 71 may be selected from, for example, a red LED chip, a blue LED chip, a green LED chip, and a yellow green LED chip.

A molding member 81 is disposed in the cavity 20 of the body 10, and the molding member 81 includes a light-transmitting resin such as silicone or epoxy, and may be formed in a single layer or multiple layers. A phosphor for changing a wavelength of light emitted on the molding member 81 or the light emitting chip 71 may be included, and the phosphor excites a part of the light emitted from the light emitting chip 71 to emit the light of a different wavelengths. The phosphor may be selectively formed from quantum dots, YAG, TAG, Silicate, Nitride, and Oxy-nitride-based materials. The phosphor may include at least one of a red phosphor, a yellow phosphor, and a green phosphor, but is not limited thereto. The surface of the molding member 81 is an emission surface and may be formed in a flat shape, a concave shape, a convex shape, etc., but is not limited thereto. As another example, a light-transmitting film having a phosphor may be disposed on the cavity 20, but is not limited thereto.

A lens may be further formed on the upper portion of the body 10, and the lens may include a concave or convex lens structure, and control light distribution of light emitted by the light source 100. A semiconductor device such as a light receiving device or a protection device may be mounted on the body 10 or any one lead frame, and the protection device may be implemented by a thyristor, a Zener diode, or a transient voltage suppression (TVS), and the Zener diode protects the light emitting chip from electrostatic discharge (ESD).

The first and second bonding portions 32 and 42 of the light source 100 may be bonded to the electrode patterns 213 and 215 of the substrate 401 with conductive adhesive members 203 and 205, and the conductive adhesive members 203 and 205 may include a solder material or a conductive tape.

A lighting device or a unit having the same according to an embodiment of the invention may be applied to a head lamp, a car width lamp, a side mirror lamp, a fog lamp, a tail lamp, a turn signal lamp, a backup lamp, and a brake lamp It may be applied to (stop lamp), daytime running right, vehicle interior lighting, door scarf, and rear combination lamp. For example, on the vehicle, the lamp unit may be applied to a lamp such as a daytime running light, a reversing light, or a direction indicator light to increase the central brightness.

The characteristics, structures and effects described in the above-described embodiments are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a modified example are included in the scope of the invention. In addition, embodiments are mostly described above. However, they are only examples and do not limit the invention. A person skilled in the art may appreciate that several variations and applications not presented above may be made without departing from the essential characteristics of the embodiments. For example, each component particularly represented in the embodiments may be varied. In addition, it should be construed that differences related to such a variation and such an application are included in the scope of the invention defined in the following claims.

An embodiment of the invention provides a lighting module and a lighting device that provides a surface light source.

An embodiment of the invention provides a lighting module and a lighting device in which protrusions of metallic material are arranged on a substrate.

An embodiment of the invention provides a lighting module and a lighting device in which protrusions formed of metallic materials are arranged in an exit direction of a light source.

An embodiment of the invention provides a lighting module and a lighting device in which metallic protrusions arranged through opening portions of a protective layer are arranged on a metal layer of a substrate.

An embodiment of the invention provides a lighting module and a lighting device in which metallic protrusions disposed on a substrate have a long length in one direction and are arranged in a direction parallel to the exit surface of the light source.

An embodiment of the invention provides a lighting module and a lighting device having a resin layer covering a light source and metallic protrusions.

An embodiment of the invention provides a lighting module for irradiating a surface light source and a lighting device having the same.

An embodiment of the invention may provide a backlight unit having a lighting module, a liquid crystal display, or a vehicle lamp.

Technical Solution

A lighting device according to an embodiment of the invention includes a substrate including a metal layer; a plurality of light sources arranged in a first direction on the substrate; a plurality of protrusions having a length in the first direction on the metal layer; and a resin layer disposed on the plurality of light sources and the plurality of protrusions, wherein the metal layer includes a first metal layer electrically connected to the light source and a second metal layer coupled to the plurality of protrusions, and the first metal layer and the second metal layer are separated from each other, and the plurality of protrusions may be disposed to be spaced apart from each other in a second direction perpendicular to the first direction.

According to an embodiment of the invention, a reflective portion is disposed on the substrate, and the reflective portion may be disposed between the plurality of protrusions.

According to an embodiment of the invention, the highest upper surface of the protrusion may be disposed higher than the upper surface of the reflective portion.

According to an embodiment of the invention, the resin layer includes a first side surface and a second side surface facing the first side surface, and the plurality of light sources are disposed adjacent to the first side surface and have an emission surface to emit light toward the second side surface.

According to an embodiment of the invention, a surface of the plurality of protrusions includes a convex curved surface, and the plurality of protrusions may have a length of 70% or more of the length of the first direction of the substrate. According to an embodiment of the invention, at least some of the plurality of protrusions may be arranged spaced apart from each other in the first direction.

According to an embodiment of the invention, the second metal layer is separated into a plurality, each of the separated second metal layers may be arranged to correspond to each of the plurality of protrusions. According to an embodiment of the invention, the reflective portions may be respectively disposed between the plurality of second metal layers.

According to an embodiment of the invention, the plurality of protrusions may include at least one of Ag—Sn-based, Cu—Sn-based, Au—Sn-based, or Sn—Ag—Cu-based. According to an embodiment of the invention, the plurality of protrusions may be disposed between the light source and one side of the resin layer.

Advantageous Effects

According to an embodiment of the invention, a light intensity of the surface light source in the lighting module may be improved.

According to an embodiment of the invention, an adhesion of the pattern using the metallic protrusion in the lighting module may be improved.

According to an embodiment of the invention, a thickness of the module may be reduced by a removal of a reflective film.

According to an embodiment of the invention, a manufacturing process of the module may be simplified by a removal of the reflective film.

According to an embodiment of the invention, since a reflective protrusion in the opening portion of a protective layer of the substrate is disposed, it may be easy to implement a variety of pattern shapes.

According to an embodiment of the invention, a reflective region may be increased by arranging reflective protrusions in the opening portions of the protective layer of the substrate.

An optical reliability of the lighting module and the lighting device having the same according to an embodiment of the invention may improve.

A reliability of the lighting device for a vehicle having a lighting module according to an embodiment of the invention may improve.

An embodiment of the invention may be applied to a backlight unit having a lighting module, various display devices, a surface light source lighting device, or a vehicle lamp.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
   a substrate;
   a light source disposed on the substrate;
   a resin layer disposed on the substrate and the light source; and
   a reflective pattern disposed on the substrate,
   wherein the light source is disposed in the resin layer and connected to the substrate,
   wherein the light source is a device having a light emitting diode chip,
   wherein an upper portion of the substrate includes a first layer of an insulating material,
   wherein the reflective pattern includes a plurality of protrusions,
   wherein each of the plurality of protrusions includes a lower portion embedded in the first layer and an upper portion protruding more than an upper surface of the first layer, wherein each of the plurality of protrusions is formed of a material different from the insulating material of the first layer, and wherein each of the plurality of protrusions has a height greater than a thickness of the first layer in a vertical direction.

2. The lighting device of claim 1, wherein the substrate includes a second layer of an insulating material, and a third layer of a metal material between the first layer and the second layer.

3. The lighting device of claim 2, wherein the third layer includes a first metal layer electrically connected to the light source and a second metal layer in which the plurality of protrusions overlaps in the vertical direction.

4. The lighting device of claim 1, wherein the plurality of protrusions is formed of a material having a higher reflectivity than that of the insulating material of the first layer.

5. The lighting device of claim 1, wherein a height difference between an upper end of at least one of the protrusions and the upper surface of the first layer is smaller than a distance between the upper surface of the first layer and the light emitting diode chip.

6. The lighting device of claim 5, wherein the height difference between the upper end of at least one of the protrusions and the upper surface of the first layer is in a range of 10 μm to 400 μm.

7. The lighting device of claim 1, wherein a width of at least one of the protrusions is wider than an interval between adjacent protrusions.

8. The lighting device of claim 1, wherein the reflective pattern includes a solder paste material.

9. The lighting device of claim 1, wherein the light source emits light toward the plurality of protrusions, and wherein the plurality of protrusions is arranged to be spaced apart from each other in a direction in which the light is emitted from a region adjacent to the light source.

10. The lighting device of claim 1, wherein the light source emits light in a second direction in which the plurality of protrusions is arranged, wherein each of the plurality of protrusions has a width in the second direction smaller than a length in a first direction orthogonal to the second direction.

11. A lighting device comprising:
a substrate;
a light source disposed on the substrate;
a resin layer disposed on the substrate and the light source; and
a reflective pattern disposed on the substrate,
wherein the light source is disposed in the resin layer and connected to the substrate,
wherein the light source is a device having a light emitting diode chip,
wherein an upper portion of the substrate includes a first layer of an insulating material,
wherein the reflective pattern includes a plurality of protrusions,
wherein each of the plurality of protrusions includes a lower portion embedded in the first layer and an upper portion protruding more than an upper surface of the first layer,
wherein each of the plurality of protrusions is formed of a material different from the insulating material of the first layer,
wherein each of the plurality of protrusions has a height greater than a thickness of the first layer, wherein the first layer is disposed around a lower portion of the light source, and wherein each of the plurality of protrusions is exposed on the first layer through the first layer.

12. The lighting device of claim 11, wherein the substrate includes a second layer of an insulating material, and a third layer of a metal material between the first layer and the second layer, and wherein the first layer and the second layer are different insulating materials.

13. The lighting device of claim 12, wherein the third layer includes a first metal layer electrically connected to the light source and a second metal layer in which the plurality of protrusions overlaps in a vertical direction, and wherein a portion of the first layer is disposed between the first and second metal layers.

14. The lighting device of claim 13, wherein the plurality of protrusions is formed of a material having a higher reflectivity than that of the insulating material of the first layer, and wherein an area of the first metal layer is smaller than an area of the second metal layer.

15. The lighting device of claim 13, wherein a height difference between an upper end of at least one of the protrusions and the upper surface of the first layer is smaller than a distance between the upper surface of the first layer and the light emitting diode chip.

16. The lighting device of claim 15, wherein the height difference between the upper end of at least one of the protrusions and the upper surface of the first layer is in a range of 10 μm to 400 μm.

17. The lighting device of claim 11, wherein at least one of the plurality of protrusions has a first length in a first direction and a first width in a second direction, wherein each of the plurality of protrusions is arranged to be spaced apart from each other in the second direction in which light is emitted from a region adjacent to the light source, and wherein the first width is wider than an interval between adjacent protrusions.

18. The lighting device of claim 11, wherein the reflective pattern includes a solder paste material.

19. The lighting device of claim 11, wherein the substrate includes the reflective pattern, and wherein the plurality of protrusions and the first layer are in contact with the resin layer.

20. A lighting device comprising:
a substrate;
a plurality of light sources disposed on the substrate;
a resin layer disposed on the substrate and the plurality of light sources; and
a reflective pattern disposed on the substrate,
wherein the plurality of light sources is disposed in the resin layer and connected to the substrate,
wherein each of the plurality of light sources is a device having a light emitting diode chip,
wherein an upper portion of the substrate includes a first layer of an insulating material,
wherein the reflective pattern includes a plurality of protrusions,
wherein each of the plurality of protrusions includes a lower portion embedded in the first layer and an upper portion protruding more than an upper surface of the first layer,
wherein each of the plurality of protrusions is formed of a material different from the insulating material of the first layer, wherein each of the plurality of protrusions has a height greater than a thickness of the first layer, wherein the first layer is disposed around a lower portion of the plurality of light sources, wherein each of the plurality of protrusions is exposed on the first layer through the first layer, wherein each of the plurality of light sources is exposed on the first layer through the first layer, and wherein the plurality of protrusions is arranged in a direction in which light is emitted from each of the light sources.

\* \* \* \* \*